(12) United States Patent
Lai et al.

(10) Patent No.: US 10,459,341 B2
(45) Date of Patent: Oct. 29, 2019

(54) MULTI-CONFIGURATION DIGITAL LITHOGRAPHY SYSTEM

(71) Applicant: Applied Materials, Inc., Santa Clara, CA (US)

(72) Inventors: Chien-Hua Lai, Taichung (TW);
Ching-Chang Chen, Tainan (TW);
Shih-Hao Kuo, Hsinchu (TW);
Tsu-Hui Yang, Dongkung Town (TW);
Hsiu-Jen Wang, Taichung (TW);
Yi-Sheng Liu, Tsubei (TW);
Chia-Hung Kao, Keelung (TW)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/217,024

(22) Filed: Dec. 11, 2018

(65) Prior Publication Data
US 2019/0235389 A1 Aug. 1, 2019

Related U.S. Application Data

(60) Provisional application No. 62/623,968, filed on Jan. 30, 2018.

(51) Int. Cl.
*G03F 7/20* (2006.01)

(52) U.S. Cl.
CPC .......... *G03F 7/70016* (2013.01); *G03F 7/707* (2013.01); *G03F 7/70275* (2013.01)

(58) Field of Classification Search
CPC ............. G03F 7/70275; G03F 7/70775; G03F 7/70016

USPC .......................................... 355/52, 53, 55, 67
See application file for complete search history.

(56) References Cited

U.S. PATENT DOCUMENTS

| | | | |
|---|---|---|---|
| 6,238,852 B1 | 5/2001 | Klosner | |
| 6,271,957 B1 * | 8/2001 | Quate | B01J 19/0046 204/456 |
| 6,562,544 B1 | 5/2003 | Cheung et al. | |
| 7,116,402 B2 * | 10/2006 | Gui | G03F 7/70275 355/57 |
| 7,819,079 B2 | 10/2010 | Englhardt et al. | |
| 8,390,786 B2 | 3/2013 | Laidig | |

(Continued)

OTHER PUBLICATIONS

The International Search Report and Written Opinon dated Apr. 15, 2019 for Application No. PCT/US2018/066858.

*Primary Examiner* — Hung Nguyen
(74) *Attorney, Agent, or Firm* — Patterson + Sheridan LLP

(57) ABSTRACT

Embodiments of the present disclosure generally provide a digital lithography system that can process both large area substrates as well as semiconductor device substrates, such as wafers. Both the large area substrates and the semiconductor device substrates can be processed in the same system simultaneously. Additionally, the system can accommodate different levels of exposure for forming the features over the substrates. For example, the system can accommodate very precise feature patterning as well as less precise feature patterning. The different exposures can occur in the same chamber simultaneously. Thus, the system is capable of processing both semiconductor device substrates and large area substrates simultaneously while also accommodating very precise feature patterning simultaneous with less precise feature patterning.

17 Claims, 5 Drawing Sheets

(56) References Cited

U.S. PATENT DOCUMENTS

| | | |
|---|---|---|
| 8,395,752 B2 | 3/2013 | Laidig |
| 9,383,649 B2 | 7/2016 | Bencher |
| 2005/0264777 A1* | 12/2005 | Gardner .............. G03F 7/70275 355/53 |
| 2006/0012766 A1 | 1/2006 | Klosner et al. |
| 2007/0153249 A1* | 7/2007 | Troost ................. G03F 7/70275 355/67 |
| 2015/0015859 A1 | 1/2015 | Yun et al. |
| 2017/0003598 A1 | 1/2017 | Johnson et al. |

* cited by examiner

MULTI-CONFIGURATION DIGITAL LITHOGRAPHY SYSTEM

CROSS-REFERENCE TO RELATED APPLICATIONS

This application claims benefit of U.S. Provisional Patent Application Ser. No. 62/623,968, filed Jan. 30, 2018, which is hereby incorporated by reference herein.

BACKGROUND

Field

Embodiments of the present disclosure generally relate to apparatuses, systems and methods for processing one or more substrates, and more specifically to apparatuses, systems and methods for performing photolithography processes.

Description of the Related Art

Photolithography is widely used in the manufacturing of semiconductor devices and display devices, such as liquid crystal displays (LCDs). Large area substrates are often utilized in the manufacture of LCDs. Conversely, smaller substrates, which are typically circular or at least partially circulate, are used for manufacturing semiconductor devices or, in some cases, much smaller devices than typical LCDs. These devices, be it display devices or semiconductor devices, typically have small features that are precisely formed over the substrates.

Microlithography techniques have been employed to create features for forming features on substrates. According to these techniques, a light-sensitive photoresist is applied to at least one surface of the substrate. Then, a pattern generator exposes selected areas of the light-sensitive photoresist as part of a pattern with light to cause chemical changes to the photoresist in the selective areas to prepare these selective areas for subsequent material removal and/or material addition processes to create the electrical features.

In order to continue to provide devices at the prices demanded by consumers, new apparatuses and approaches are needed to precisely and cost-effectively create patterns on substrates.

SUMMARY

Embodiments of the present disclosure generally provide a digital lithography system that can process both large area substrates as well as semiconductor device substrates, such as wafers. Both the large area substrates and the semiconductor device substrates can be processed in the same system simultaneously. Additionally, the system can accommodate different levels of exposure for forming the features over the substrates. For example, the system can accommodate very precise feature patterning as well as less precise feature patterning. The different exposures can occur in the same chamber simultaneously. Thus, the system is capable of processing both semiconductor device substrates and large area substrates simultaneously while also accommodating very precise feature patterning simultaneous with less precise feature patterning.

In one embodiment, a system, comprises a first image projection apparatus, wherein the first image projection apparatus is capable of exposing a substrate to a first resolution; a second image projection apparatus, wherein the second image projection apparatus is capable of exposing the substrate to a second resolution different from the first resolution; and a substrate support movable to position a substrate beneath the first image projection apparatus and the second image projection apparatus.

In another embodiment, a system, comprises a first image projection apparatus, wherein the first image projection apparatus is capable of exposing a substrate to a first resolution; a second image projection apparatus, wherein the second image projection apparatus is capable of exposing the substrate to a second resolution different from the first resolution; a substrate support movable to position a substrate beneath the first image projection apparatus and the second image projection apparatus, wherein the first resolution is a fine resolution and the second resolution is a regular resolution; and a chuck disposed on the substrate support.

In another embodiment, a system, comprises a first image projection apparatus, wherein the first image projection apparatus is capable of exposing a substrate to a first resolution; a second image projection apparatus, wherein the second image projection apparatus is capable of exposing the substrate to a second resolution different from the first resolution; and a substrate support movable to position a substrate beneath the first image projection apparatus and the second image projection apparatus, wherein the first resolution is a fine resolution and the second resolution is a regular resolution, wherein the first image projection apparatus includes a DMD.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Embodiments of the present disclosure generally provide a digital lithography system that can process both large area substrates as well as semiconductor device substrates, such as wafers. Both the large area substrates and the semiconductor device substrates can be processed in the same system simultaneously. Additionally, the system can accommodate different levels of exposure for forming the features over the substrates. For example, the system can accommodate very precise feature patterning as well as less precise feature patterning. The different exposures can occur in the same chamber simultaneously. Thus, the system is capable of processing both semiconductor device substrates and large area substrates simultaneously while also accommodating very precise feature patterning simultaneous with less precise feature patterning.

Figure 1A:
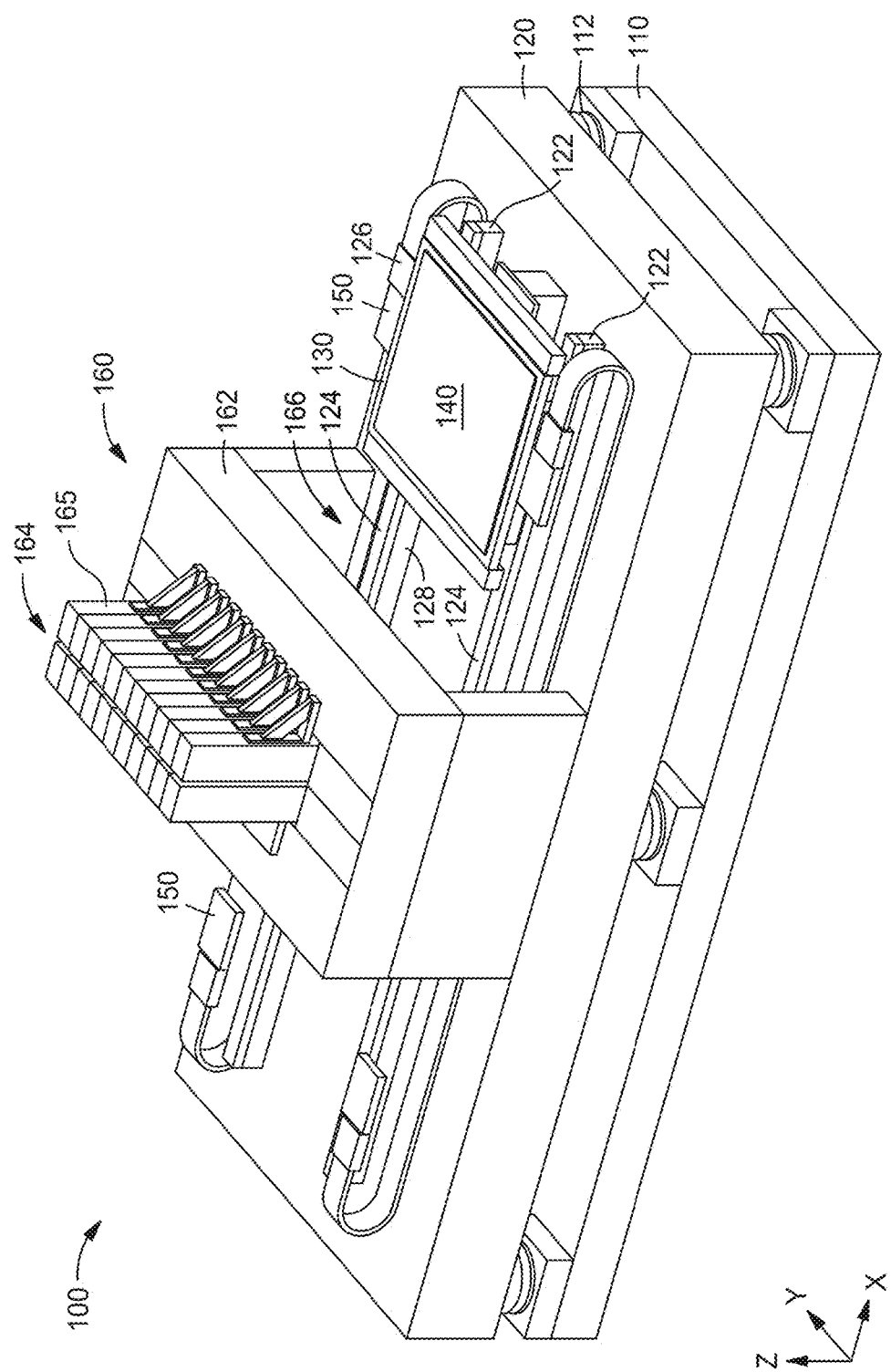
FIG. 1A is a perspective view of a photolithography system according to embodiments disclosed herein.

FIG. 1A is a perspective view of a photolithography system 100 according to embodiments disclosed herein. The system 100 includes a base frame 110, a slab 120, a stage 130, and a processing apparatus 160. The base frame 110 rests on the floor of a fabrication facility and supports the slab 120. Passive air isolators 112 are positioned between the base frame 110 and the slab 120. In one embodiment, the slab 120 is a monolithic piece of granite, and the stage 130 is disposed on the slab 120. One or more substrates, generically shown and referred to as substrate 140, are supported by the stage 130. A plurality of holes (not shown) are formed in the stage 130 for allowing a plurality of lift pins (not shown) to extend therethrough. In some embodiments, the lift pins rise to an extended position to receive the substrate 140, such as from one or more transfer robots (not shown). The one or more transfer robots are used to load and unload a substrate 140 from the stage 130.

The substrate 140 comprises any suitable material, for example, quartz or glass or semiconductor material, used as part of a flat panel display or semiconductor device. When the substrate 140 is used as part of a flat panel display, it will be referred to as a flat panel substrate. In other embodiments, the substrate 140 is made of other materials. In some embodiments, the substrate 140 has a photoresist layer formed thereon. A photoresist is sensitive to radiation. A positive photoresist includes portions of the photoresist, which when exposed to radiation, will be respectively soluble to photoresist developer applied to the photoresist after the pattern is written into the photoresist. A negative photoresist includes portions of the photoresist, which when exposed to radiation, will be respectively insoluble to photoresist developer applied to the photoresist after the pattern is written into the photoresist. The chemical composition of the photoresist determines whether the photoresist will be a positive photoresist or negative photoresist. Examples of photoresists include, but are not limited to, at least one of diazonaphthoquinone, a phenol formaldehyde resin, poly (methyl methacrylate), poly(methyl glutarimide), and SU-8. In this manner, the pattern is created on a surface of the substrate 140 to form the electronic circuitry.

The system 100 includes a pair of supports 122 and a pair of tracks 124. The pair of supports 122 are disposed on the slab 120, and the slab 120 and the pair of supports 122 are a single piece of material. The pair of tracks 124 are supported by the pair of the supports 122, and the stage 130 moves along the tracks 124 in the X-direction. In one embodiment, the pair of tracks 124 is a pair of parallel magnetic channels. As shown, each track 124 of the pair of tracks 124 is linear. In other embodiments, one or more track 124 is non-linear. An encoder 126 is coupled to the stage 130 in order to provide location information to a controller (not shown).

The processing apparatus 160 includes a support 162 and a processing unit 164. The support 162 is disposed on the slab 120 and includes an opening 166 for the stage 130 to pass under the processing unit 164. The processing unit 164 is supported by the support 162. In one embodiment, the processing unit 164 is a pattern generator configured to expose a photoresist in a photolithography process. In some embodiments, the pattern generator is configured to perform a maskless lithography process. The processing unit 164 includes a plurality of image projection apparatus (shown in FIGS. 2A and 2B). In one embodiment, the processing unit 164 contains as many as 84 image projection apparatus. Each image projection apparatus is disposed in a case 165. The processing apparatus 160 is useful to perform maskless direct patterning.

During operation, the stage 130 moves in the X-direction from a loading position, as shown in FIG. 1, to a processing position. The processing position is one or more positions of the stage 130 as the stage 130 passes under the processing unit 164. During operation, the stage 130 is be lifted by a plurality of air bearings (not shown) and moves along the pair of tracks 124 from the loading position to the processing position. A plurality of vertical guide air bearings (not shown) are coupled to the stage 130 and positioned adjacent an inner wall 128 of each support 122 in order to stabilize the movement of the stage 130. The stage 130 also moves in the Y-direction by moving along a track 150 for processing and/or indexing the substrate 140. The stage 130 is capable of independent operation and can scan a substrate 140 in one direction and step in the other direction.

A metrology system measures the X and Y lateral position coordinates of each of the stage 130 in real-time so that each of the plurality of image projection apparatus can accurately locate the patterns being written in a photoresist covered substrate. The metrology system also provides a real-time measurement of the angular position of each of the stage 130 about the vertical or Z-axis. The angular position measurement can be used to hold the angular position constant during scanning by means of a servo mechanism or it can be used to apply corrections to the positions of the patterns being written on the substrate 140 by the image projection apparatus 270, 271, shown in FIGS. 2A-2B. These techniques may be used in combination.

Figure 1B:
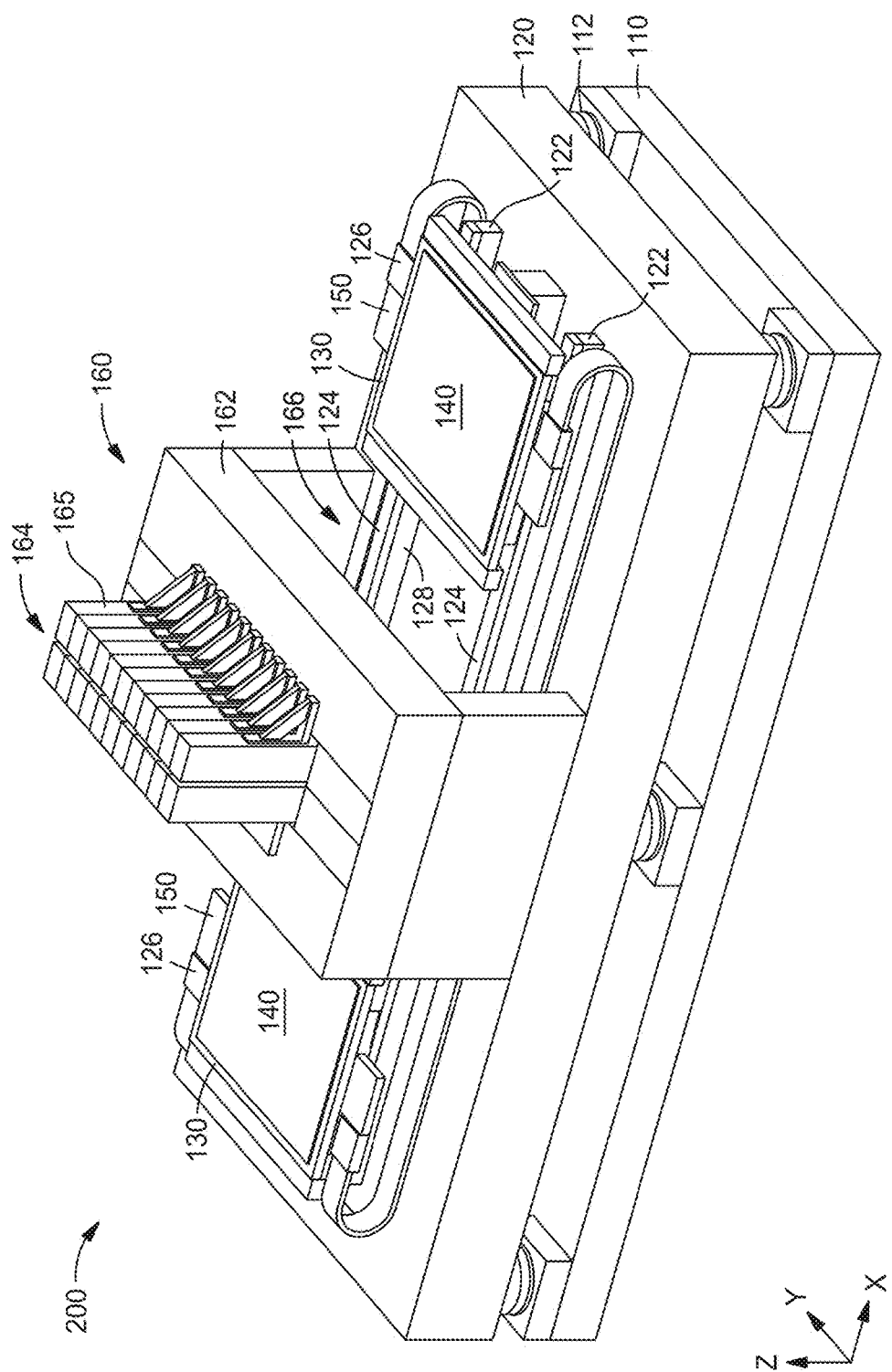
FIG. 1B is a perspective view of a photolithography system according to embodiments disclosed herein.

FIG. 1B is a perspective view of a photolithography system 200 according to embodiments disclosed herein. The system 200 is similar to the system 100; however, the system 200 includes two stages 130. Each of the two stages 130 is capable of independent operation and can scan one or more substrates 140 in one direction and step in the other direction. In some embodiments, when one of the two stages 130 is scanning a substrate 140, another of the two stages 130 is unloading an exposed substrate and loading the next substrate to be exposed.

While FIGS. 1A-1B depict two embodiments of a photolithography system, other systems and configurations are also contemplated herein. For example, photolithography systems including any suitable number of stages are also contemplated.

Figure 2A:
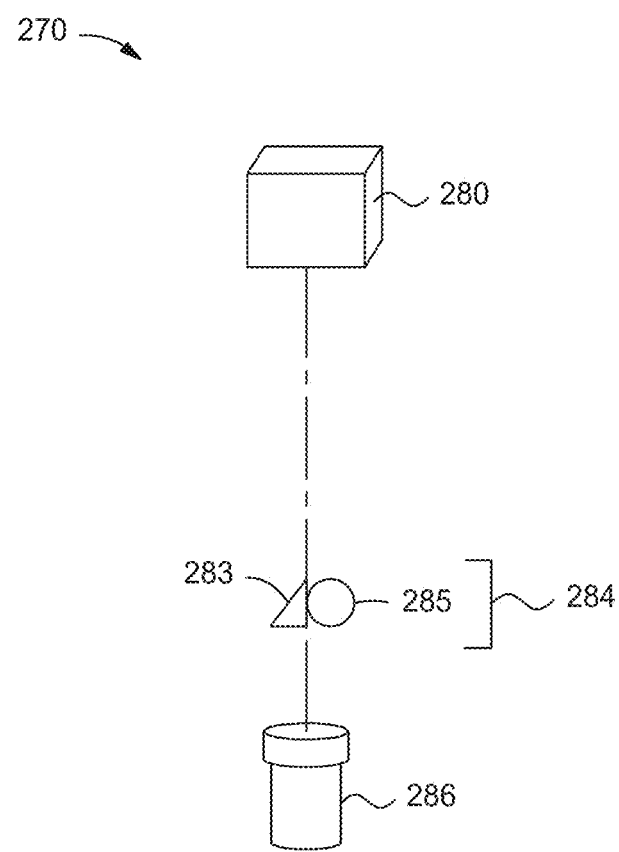
FIG. 2A is a perspective schematic view of an image projection apparatus according to embodiments disclosed herein.

FIG. 2A is a perspective schematic view of an image projection apparatus 270 according to one embodiment, which is useful for a photolithography system, such as system 100 or system 200. The image projection apparatus 270 includes one or more spatial light modulators 280, an alignment and inspection system 284 including a focus sensor 283 and a camera 285, and projection optics 286. The components of image projection apparatus vary depending on the spatial light modulator being used. Spatial light modulators include, but are not limited to, microLEDs, digital micromirror devices (DMDs) and liquid crystal displays (LCDs).

In operation, the spatial light modulator 280 is used to modulate one or more properties of the light, such as amplitude, phase, or polarization, which is projected through the image projection apparatus 270 and to a substrate, such as the substrate 140. The alignment and inspection system 284 is used for alignment and inspection of the components of the image projection apparatus 270. In one embodiment, the focus sensor 283 includes a plurality of lasers which are directed through the lens of the camera 285 and the back through the lens of the camera 285 and imaged onto sensors to detect whether the image projection apparatus 270 is in focus. The camera 285 is used to image the substrate, such as substrate 140, to ensure the alignment of the image projection apparatus 270 and photolithography system 100 or 200 is correct or within an predetermined tolerance. The projection optics 286, such as one or more lenses, is used to project the light onto the substrate, such as the substrate 140.

Figure 2B:
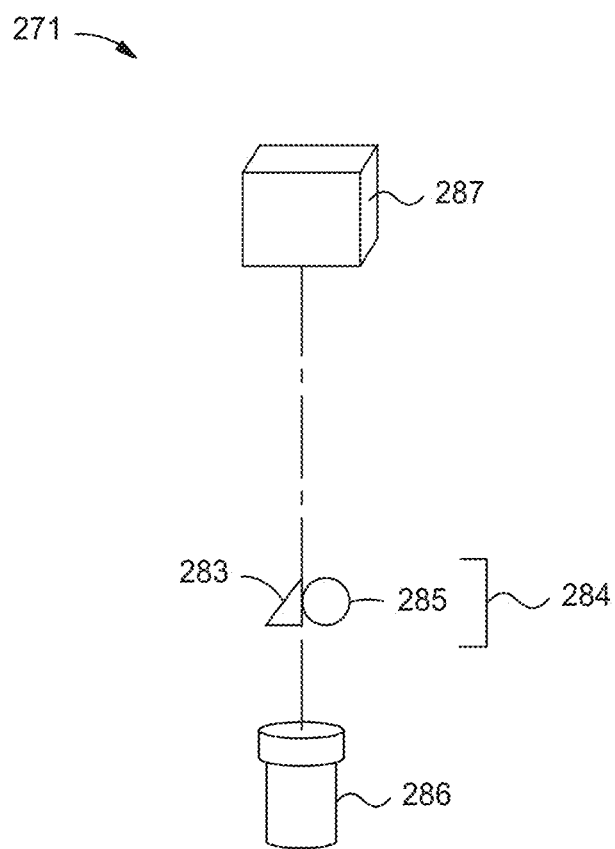
FIG. 2B is a perspective schematic view of an image projection apparatus according to embodiments disclosed herein.

FIG. 2B is an image project apparatus 271 according to embodiments described herein. In the embodiment shown in FIG. 2B, the image projection apparatus 271 includes one or more microLEDs 287 as the spatial light modulator(s), a focus sensor and camera inspection system 284 and projection optics 286. In one embodiment, the image projection apparatus 271 further includes a beamsplitter (not shown). MicroLEDs are microscopic (for example, less than about 100 µm) light emitting diodes, which may be arranged in an array and used to form the individual pixels of a substrate, such as a display device. MicroLEDs include inorganic materials, such as an inorganic Gallium Nitride (GaN) material. Since microLEDs are self-emitting, an outside light source is not needed in the image projection apparatus 271.

In embodiments using microLEDs, the camera 285 is also useful to measure the image pixel pitch of the one or more microLEDs to calibrate for any thermal expansion happening at the microLED device.

Figure 3:
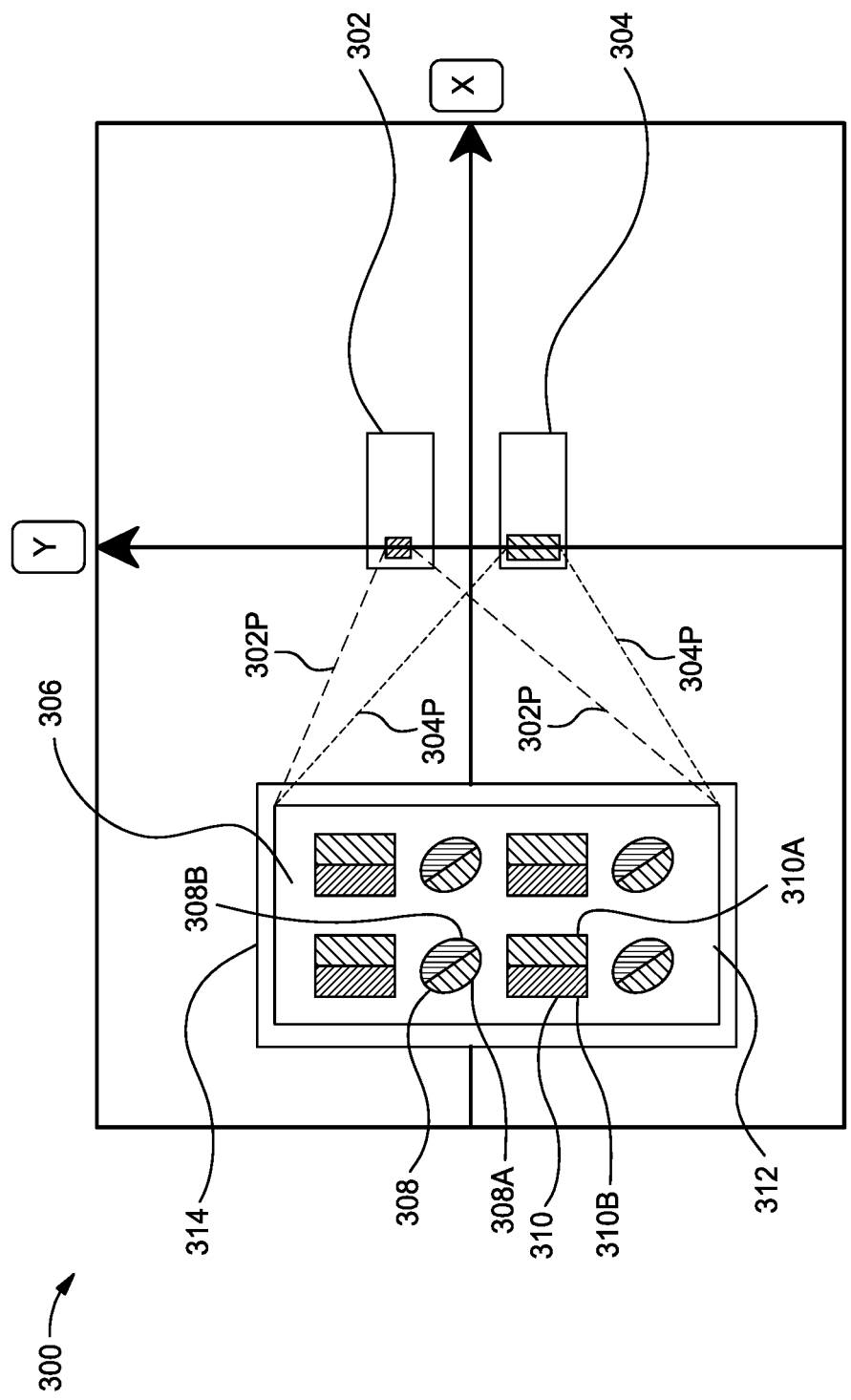
FIG. 3 is a schematic illustration of a photolithography system according to one embodiment.

FIG. 3 is a schematic illustration of a photolithography system 300 according to one embodiment. The system 300 is designed to process not only multiple substrates, but substrates of different sizes and shapes. Furthermore, the system 300 is designed to provide different exposure resolutions. The different exposure resolutions may be provided to either different substrates or even on the same substrate.

The system 300 has at least two image projection apparatus 302, 304. It is to be understood that while only two image projection apparatus 302, 304 have been shown, additional image projection apparatus 302, 304 may be present. Thus, the disclosure is not limited to two image projection apparatus 302, 304. At least one image projection apparatus 302 has a first resolution while at least one other image projection apparatus 304 has a second resolution where the first resolution is different from the second resolution. More specifically, at least one image projection apparatus 302 has a fine resolution while at least one other image projection apparatus 304 has a regular resolution compared to the fine resolution. Stated another way as a basis of comparison, the fine resolution compared to regular resolution would be a similar comparison of high definition versus regular definition.

As shown in FIG. 3, a substrate 306 is (or substrates 306 are) disposed on a stage 314. The substrate 306, after processing, may ultimately be cut up into multiple different substrates. For example, the substrate may be processed such that a plurality of a first type of substrates 308 and a plurality of a second type of substrates 310 are ultimately fabricated. Alternatively, rather than a substrate 306 that is cut into multiple substrates, multiple substrates 308, 310 may be present on the stage 314 and processed. The multiple substrates 308, 310 may comprise multiple substrates of the same shape/size or multiple substrates of different shapes/sizes. If multiple substrates 308, 310 are present, the multiple substrates 308, 310 are disposed on a chuck that carries the substrates during processing. In any scenario, there will be at least two different types exposures to the substrate(s) (i.e., fine and regular) regardless of whether a single substrate 306 is present or multiple substrates 308, 310 are present.

In the embodiment shown in FIG. 3, the first type of substrate 308 has a first area 308A processed by image projection apparatus 302 (processing of image projection apparatus 302 shown by dashed line 302P) and a second area processed by image projection apparatus 304 (processing of image projection apparatus 304 shown by dashed line 304P). Similarly, second type of substrate 310 has a first area processed by image projection apparatus 302 (processing of image projection apparatus 302 shown by dashed line 302P) and a second area processed by image projection apparatus 304 (processing of image projection apparatus 304 shown by dashed line 304P). In other words, the substrates 308, 310 are processed such that a fine resolution is processed on a first portion of the substrate and a regular resolution is processed in a second portion of the substrate. Additionally, in the case of a substrate 306 that is to be cut into multiple substrates, the remaining portion 312 of the substrate 306 is processed with a combination of both image projection apparatus 302 and image projection apparatus 304. Hence, there are three different exposure types shown in FIG. 3. As the number of image projection apparatus increases, so does the total number of possible exposure types for the various substrates. Both image projection apparatus 302, 304 are able to process/expose all areas of the substrate 306. Hence, the stage 314 is movable in the X-Y plane to make sure the entire substrate area is exposable to the two image projection apparatus 302, 304 present in FIG. 3. It is to be noted that the different exposure resolutions are to the same level of the substrate being processed. Thus, different exposure levels are possible to be applied to the same level of the substrate. Additionally, the different exposure levels to the same level of the substrate occur within the same system.

The image projection apparatus 302, 304 are above the substrate 306 and are used to transfer digitally controlled patterns onto the substrate with various resolutions. The system 300 can expose patterns, via light, combined with critical and non-critical dimensions in the same layer; critical dimension patterns can be exposed by a fine resolution apparatus 302 while the remaining non-critical patterns can be exposed by either the other apparatus 304 or a combination of both apparatuses 302, 304.

By utilizing at least two different image projection apparatus where each image at least two different image projection apparatus have different resolutions, the system is capable of providing at least two different exposure levels to the same level within the substrate. Additionally, the system can process both semiconductor device substrates and large area substrates simultaneously while also accommodating very precise feature patterning simultaneous with less precise feature patterning.

While the foregoing is directed to examples of the present disclosure, other and further examples of the disclosure may be devised without departing from the basic scope thereof, and the scope thereof is determined by the claims that follow.

What is claimed is:

1. A system, comprising:
  a first image projection apparatus, wherein the first image projection apparatus is configured to expose a plurality of substrates to a first pattern, wherein the plurality of substrates includes at least one substrate that is a different size or shape than any of the other substrates;

a second image projection apparatus, wherein the second image projection apparatus is configured to expose the plurality of substrates to a second pattern, wherein the resolution of the first pattern is different from the resolution of the second pattern;

a substrate support movable to position the plurality of substrates beneath the first image projection apparatus and the second image projection apparatus;

a slab;

a pair of supports disposed on the slab; and a pair of tracks supported by the pair of supports, the substrate support disposed on the pair of tracks, wherein the pair of tracks is a pair of parallel magnetic channels.

2. The system of claim 1, further comprising a chuck disposed on the substrate support.

3. The system of claim 2, wherein the chuck is configured to support the plurality of substrates.

4. The system of claim 1, wherein the first image projection apparatus comprises a digital micromirror device (DMD).

5. The system of claim 1, wherein the first image projection apparatus comprises a micro light emitting diode (microLED).

6. A system, comprising:

a first image projection apparatus, wherein the first image projection apparatus is configured to expose a plurality of substrates to a first pattern, wherein the plurality of substrates includes at least one substrate that is a different size or shape than any of the other substrates;

a second image projection apparatus, wherein the second image projection apparatus is configured to expose the plurality of substrates to a second pattern, wherein the resolution of the first pattern is greater than the resolution of the second pattern;

a substrate support movable to position the plurality of substrates beneath the first image projection apparatus and the second image projection apparatus; a chuck disposed on the substrate support;

a slab;

a pair of supports disposed on the slab; and a pair of tracks supported by the pair of supports, the substrate support disposed on the pair of tracks, wherein the pair of tracks is a pair of parallel magnetic channels.

7. The system of claim 6, wherein the chuck is configured to support the plurality of substrates.

8. The system of claim 7, wherein the first image projection apparatus comprises a digital micro mirror device (DMD).

9. The system of claim 7, wherein the first image projection apparatus comprises a micro light emitting display (microLED).

10. The system of claim 6, wherein the first image projection apparatus comprises a DMD.

11. The system of claim 9, wherein the first image projection apparatus comprises a microLED.

12. A system, comprising:

a first image projection apparatus, wherein the first image projection apparatus is configured to expose a plurality of substrates to a first pattern, wherein the plurality of substrates includes at least one substrate that is a different size or shape than any of the other substrates;

a second image projection apparatus, wherein the second image projection apparatus is configured to expose the plurality of substrates to a second pattern, wherein the resolution of the first pattern is greater than the resolution of the second pattern;

a substrate support movable to position the plurality of substrates beneath the first image projection apparatus and the second image projection apparatus, wherein the first image projection apparatus comprises a digital micromirror device (DMD);

a slab;

a pair of supports disposed on the slab; and a pair of tracks supported by the pair of supports, the substrate support disposed on the pair of tracks, wherein the pair of tracks is a pair of parallel magnetic channels.

13. The system of claim 12, further comprising a chuck disposed on the substrate support.

14. The system of claim 12, wherein the system is a photolithography system.

15. The system of claim 5, wherein the first image projection apparatus comprises a camera, the camera configured to measure the image pixel pitch of the microLED to calibrate for any thermal expansion happening at the microLED.

16. The system of claim 9, wherein the first image projection apparatus comprises a camera, the camera configured to measure the image pixel pitch of the microLED to calibrate for any thermal expansion happening at the microLED.

17. The system of claim 12, wherein the first image projection apparatus comprises a camera and a microLED, the camera configured to measure the image pixel pitch of the microLED to calibrate for any thermal expansion happening at the microLED.

* * * * *